United States Patent
Katsunuma et al.

(10) Patent No.: US 9,147,580 B2
(45) Date of Patent: Sep. 29, 2015

(54) PLASMA ETCHING METHOD AND PLASMA PROCESSING APPARATUS

(71) Applicant: TOKYO ELECTRON LIMITED, Tokyo (JP)

(72) Inventors: Takayuki Katsunuma, Miyagi (JP); Masanobu Honda, Miyagi (JP); Hironobu Ichikawa, Miyagi (JP); Jin Kudo, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 80 days.

(21) Appl. No.: 13/854,412

(22) Filed: Apr. 1, 2013

(65) Prior Publication Data

US 2013/0267094 A1 Oct. 10, 2013

Related U.S. Application Data

(60) Provisional application No. 61/623,689, filed on Apr. 13, 2012.

(30) Foreign Application Priority Data

Apr. 5, 2012 (JP) ................................ 2012-086179

(51) Int. Cl.
*H01L 21/3065* (2006.01)
*H01L 21/67* (2006.01)
*H01J 37/32* (2006.01)
*H01L 21/311* (2006.01)
*H01L 21/027* (2006.01)

(52) U.S. Cl.
CPC ....... *H01L 21/3065* (2013.01); *H01J 37/32669* (2013.01); *H01L 21/31138* (2013.01); *H01L 21/31144* (2013.01); *H01L 21/67069* (2013.01); *H01J 2237/334* (2013.01); *H01L 21/0276* (2013.01)

(58) Field of Classification Search
CPC combination set(s) only.
See application file for complete search history.

(56) References Cited

U.S. PATENT DOCUMENTS

| | | | |
|---|---|---|---|
| 2005/0048785 A1* | 3/2005 | Kang et al. | 438/696 |
| 2005/0069807 A1* | 3/2005 | Jung | 430/270.1 |
| 2005/0103748 A1* | 5/2005 | Yamaguchi et al. | 216/67 |
| 2007/0026677 A1* | 2/2007 | Ji et al. | 438/689 |
| 2008/0038927 A1* | 2/2008 | Yamaguchi et al. | 438/706 |

FOREIGN PATENT DOCUMENTS

JP 2008-505497 A 2/2008

* cited by examiner

*Primary Examiner* — Duy Deo
*Assistant Examiner* — Erin Bergner
(74) *Attorney, Agent, or Firm* — Rothwell, Figg, Ernst & Manbeck, P.C.

(57) ABSTRACT

A plasma etching method for plasma etching, in a processing chamber, an antireflection film laminated on an organic film formed on a substrate by using an etching mask made of a resist film formed on the antireflection film, the plasma etching method includes: depositing a Si-containing compound on the etching mask made of the resist film by using plasma of Si-containing gas in the processing chamber; and etching the antireflection film in a state where the Si-containing compound is deposited on the etching mask.

7 Claims, 17 Drawing Sheets

FIG. 6

| SiCl4 chemistry | Initial | O2 | N2 | HBr | COS | CF4 | SF6 | NF3 |
|---|---|---|---|---|---|---|---|---|
| Profile After Coating | | | | | | | | |
| Profile After Si-ARC etch | | | | | | | | |
| PR Height(nm) | 7.9 | 19.8 | 9.5 | 7.9 | 4.0 | -14.3 | -14.3 | -26.2 |
| PR loss (nm) | 48.4 | 44.4 | 44.5 | 38.9 | 42.8 | 54.8 | 44.3 | 55.6 |
| Top View After Si-ARC etch | | | | | | | | |
| LWR (nm) | 4.0 | 3.6 | 4.1 | 3.4 | 3.2 | 3.8 | 3.3 | 5.2 |
| CD (nm) | 23.6 | 21.8 | 28.5 | 26.4 | 28.5 | 24.2 | 20.7 | 23.9 |

FIG. 7

| | O2=0 | O2=25 | O2=100sccm | O2=250sccm |
|---|---|---|---|---|
| PR Height(nm) | 11.3 | 24.1 | 29.1 | 31 |
| PR loss(nm) | 34.2 | 35.7 | 39.7 | 36.7 |
| LWR(nm) | 3.5 | 3.4 | 3.6 | 3.5 |
| CD(nm) | 26.4 | 29.4 | 32.6 | 31.2 |

FIG. 8

| Gas | Initial | HF 200W | HF 500W | HF 800W | HF 1500W |
|---|---|---|---|---|---|
| Profile After Coating | | | | | |
| Profile After Si-ARC etch | | | | | |
| PR Height (nm) | 7.9 | 16.7 | 19.8 | 21.4 | 21.4 |
| PR loss (nm) | 48.4 | 39.6 | 44.4 | 41.3 | 38.1 |
| Top View After Si-ARC etch | | | | | |
| LWR (nm) | 4.0 | 3.7 | 3.6 | 3.4 | 3.6 |
| CD (nm) | 23.6 | 23.9 | 21.8 | 23.3 | 23.7 |

FIG. 9

| Gas | Initial | Press. 0.67Pa | Press. 1.33Pa | Press. 4Pa |
|---|---|---|---|---|
| Profile After Coating | | | | |
| Profile After Si-ARC etch | | | | |
| PR Height(nm) | 7.9 | 11.9 | 19.8 | 19.0 |
| PR loss (nm) | 48.4 | 46.8 | 44.4 | 46.9 |
| Top View After Si-ARC etch | | | | |
| LWR (nm) | 4.0 | 3.6 | 3.6 | 3.7 |
| CD (nm) | 23.6 | 22.3 | 21.8 | 24.4 |

FIG. 10

| Gas | Initial | He 0sccm | He 100sccm | He 200sccm |
|---|---|---|---|---|
| Profile After Coating | | | | |
| Profile After Si-ARC etch | | | | |
| PR Height (nm) | 7.9 | 19.6 | 19.2 | 19.8 |
| PR loss (nm) | 48.4 | 41.1 | 42.5 | 44.4 |
| Top View After Si-ARC etch | | | | |
| LWR (nm) | 4.0 | 5.3 | 5.2 | 3.6 |
| CD (nm) | 23.6 | 26.9 | 25.1 | 21.8 |

FIG. 11

| Gas | Initial | Time 5sec | Time 10sec | Time 15sec |
|---|---|---|---|---|
| Profile After Coating | | | | |
| Profile After Si-ARC etch | | | | |
| PR Height (nm) | 7.9 | 19.8 | 33.3 | 38.1 |
| PR loss (nm) | 48.4 | 44.4 | 39.7 | 40.5 |
| Top View After Si-ARC etch | | | | |
| LWR (nm) | 4.0 | 3.6 | 3.5 | 3.7 |
| CD (nm) | 23.6 | 21.8 | 28.7 | 29.5 |

FIG. 12

| Gas | Initial | HF 200W | HF 500W | HF 800W | HF 1500W |
|---|---|---|---|---|---|
| Profile After Coating | | | | | |
| Profile After Si-ARC etch | | | | | |
| PR Height (nm) | 7.9 | 15.9 | 17.4 | 16.4 | 17.4 |
| PR loss (nm) | 48.4 | 37.3 | 35.9 | 38.8 | 38.0 |
| Top View After Si-ARC etch | | | | | |
| LWR (nm) | 4.0 | 3.4 | 3.9 | 3.9 | 3.6 |
| CD (nm) | 23.6 | 22.2 | 23.0 | 21.3 | 23.0 |

FIG. 13

| Gas | Initial | Press 0.67Pa | Press 1.33Pa | Press 4Pa | Press 8Pa |
|---|---|---|---|---|---|
| Profile After Coating | | | | | |
| Profile After Si-ARC etch | | | | | |
| PR Height (nm) | 7.9 | 16.7 | 17.4 | 15.9 | 16.3 |
| PR loss (nm) | 48.4 | 36.6 | 35.9 | 41.2 | 41.6 |
| Top View After Si-ARC etch | | | | | |
| LWR (nm) | 4.0 | 4.0 | 3.9 | 4.1 | 4.3 |
| CD (nm) | 23.6 | 23.6 | 23.0 | 23.5 | 23.0 |

*FIG. 14*

| Gas | Initial | Flow 5sscm | Flow 15sccm | Flow 25sccm | Flow 50sccm | Flow 100sccm |
|---|---|---|---|---|---|---|
| Profile After Coating | | | | | | |
| Profile After Si-ARC etch | | | | | | |
| PR Height (nm) | 7.9 | 5.2 | 14.2 | 17.4 | 19.0 | 15.9 |
| PR loss (nm) | 48.4 | 31.9 | 34.4 | 36.0 | 37.6 | 38.9 |
| Top View After Si-ARC etch | | | | | | |
| LWR (nm) | 4.0 | 3.3 | 3.6 | 3.9 | 3.4 | 3.1 |
| CD (nm) | 23.6 | 20.2 | 20.3 | 23.0 | 24.4 | 24.4 |

FIG. 15

| Gas | Initial | He 0sccm | He 200sccm | He 400sccm |
|---|---|---|---|---|
| Profile After Coating | | | | |
| Profile After Si-ARC etch | | | | |
| PR Height (nm) | 7.9 | 18.2 | 19.0 | 18.2 |
| PR loss (nm) | 48.4 | 38.9 | 37.6 | 38.1 |
| Top View After Si-ARC etch | | | | |
| LWR (nm) | 4.0 | 3.6 | 3.4 | 3.9 |
| CD (nm) | 23.6 | 24.7 | 24.4 | 24.0 |

FIG. 16

| Gas | Initial | Time 5sec | Time 10sec | Time 15sec | Time 30sec | Time 60sec |
|---|---|---|---|---|---|---|
| Profile After Coating | | | | | | |
| Profile After Si-ARC etch | | | | | | |
| PR Height (nm) | 7.9 | 19.0 | 19.8 | 20.2 | 21.02 | 21.0 |
| PR loss (nm) | 48.4 | 37.6 | 37.7 | 37.7 | 38.0 | 38.5 |
| Top View After Si-ARC etch | | | | | | |
| LWR (nm) | 4.0 | 3.4 | 3.6 | 3.5 | 3.3 | 4.4 |
| CD (nm) | 23.6 | 24.4 | 25.6 | 25.0 | 25.7 | 26.8 |

PLASMA ETCHING METHOD AND PLASMA PROCESSING APPARATUS

CROSS-REFERENCE TO RELATED APPLICATIONS

This application claims priorities to Japanese Patent Application No. 2012-086179 filed on Apr. 5, 2012, and U.S. Provisional Application No. 61/623,689 filed on Apr. 13, 2012, the entire contents of each of which are incorporated herein by reference.

FIELD OF THE INVENTION

The present invention relates to a method of performing plasma etching on an object to be processed and a plasma processing apparatus for performing the plasma etching.

BACKGROUND OF THE INVENTION

Recently, with a trend toward miniaturization and high-integration of semiconductor devices, EUV (Extreme Ultra Violet) lithography technology using EUV light of 13.5 nm, which is shorter compared to an ArF excimer laser (with wavelength of 193 nm) mainly used in current photolithography technologies of semiconductor devices, is drawing attention as a next generation technology that makes it possible to fabricate a hyperfine pattern of 20 nm or less.

However, a thickness of an EUV resist film is about 50 nm, which is less than half the thickness of an ArF resist film that is now widely used. For this reason, when a film to be etched (a base film, referred to as an etching-target film) is plasma etched by using the EUV resist as a mask, the EUV resist mask is also etched, so that a thickness or line width of the etching-target film cannot be made to a desired value.

Japanese Patent Application Publication No. 2008-505497 discloses a method of performing a plasma etching process by using, as a mask, a resist which has a small thickness and is formed of two layers.

In the method disclosed in the above-cited reference, a pattern is formed by an exposure process on an upper layer of the resist and then a lower layer of the resist is etched with a silicon-containing gas, $SiCl_4$. The silicon-containing gas is deposited on the side wall of the lower layer when the lower layer is etched, and an etching mask of the two-layer resist is formed by realizing anisotropic etching.

In photolithography technologies, an antireflection film is commonly formed since it prevents the dimensional percision of a resist from deteriorating after being developed by reflecting light of a light source off the silicon substrate when the resist film is exposed. The above-described EUV resist film is useful in etching the antireflection film.

However, as disclosed in the above-cited reference, when the etching mask is formed by the anisotropic etching, it is very difficult to precisely adjust a size in the horizontal direction of the etching mask. Therefore, it is difficult to make the line width of the etching-target film be a desired value.

SUMMARY OF THE INVENTION

In view of the above, the present invention provides a plasma etching method of performing a plasma etching process by using a EUV resist as a mask, which is capable of performing micro-fabrication with a desired dimensional precision on an etching-target film by improving the remaining of the EUV resist mask after etching.

In accordance with an aspect of the present invention, there is provided a plasma etching method for plasma etching, in a processing chamber, an antireflection film laminated on an organic film formed on a substrate by using an etching mask made of a resist film formed on the antireflection film, the plasma etching method including: depositing a Si-containing compound on the etching mask made of the resist film by using plasma of Si-containing gas in the processing chamber; and etching the antireflection film in a state where the Si-containing compound is deposited on the etching mask.

According to tests performed by the present inventors, it has been confirmed that the Si-containing compound was deposited more thickly on the upper surface of the resist film than on the side surface thereof by pre-coating the resist film with a gas containing $SiCl_4$ or $SiF_4$ supplied into the processing chamber. The present invention is based on the tests and, according to the present invention, the Si-containing compound is deposited on the resist film by using the gas containing $SiCl_4$, before etching. At this time, the Si-containing compound is deposited more thickly on the upper surface of the resist film than on the side surface thereof. Accordingly, a thickness of the remaining resist film after the plasma etching process can be prevented from becoming below a desired thickness. As a result, even when an etching mask having a small thickness such as, e.g., EUV resist is used, a masked portion of the antireflection film can be prevented from being etched in the height direction thereof. Further, since an increase in a width direction of the resist film is suppressed to a minimum due to the pre-coating, an effect on a line width of the antireflection film after etching can be suppressed to a minimum. Therefore, according to the present invention, the micro-fabrication can be performed with a desired dimensional precision on the etching-target film.

Further, the resist film may be an EUV resist film.

Further, a thickness of the EUV resist film may be 20 to 50 nm.

Further, the Si-containing gas may be a gas mixture of $SiCl_4$ gas and $O_2$ gas, and a flow rate ratio of the $SiCl_4$ gas to the $O_2$ gas may be 1:4 to 1:10. Alternatively, the Si-containing gas may be a gas mixture of $SiF_4$ gas and $H_2$ gas, and a flow rate ratio of the $SiF_4$ gas to the $H_2$ gas may be 1:1 to 1:4.

Further, He may be added to the gas mixture of $SiCl_4/O_2$ or the gas mixture of $SiF_4/H_2$.

Further, the antireflection film may be an organic film containing Si.

Further, the antireflection film may be etched with plasma of $CF_4$ gas.

Further, the antireflection film may be etched with plasma of $CF_4/CH_2F_2$ gas.

In accordance with an another aspect of the present invention, there is provided a plasma processing apparatus for plasma etching an antireflection film laminated on an organic film formed on a substrate, the plasma processing apparatus including: a processing chamber configured to accommodate the substrate; a high frequency power supply configured to apply a high frequency power to an upper electrode and a lower electrode provided in the processing chamber; and a processing gas supply source configured to supply a processing gas into the processing chamber, wherein the processing gas supply source includes: a coating gas supply unit configured to supply a Si-containing gas used to deposit a Si-containing compound on an etching mask made of an EUV resist film formed on the antireflection film; and an etching gas supply unit configured to supply an etching gas used to etch the etching mask after the Si-containing compound is deposited.

In accordance with the present invention, in performing the plasma etching process by using a EUV resist as the mask, micro-fabrication can be performed with a desired dimensional precision on an etching-target film by improving the remaining portions of the EUV resist mask after etching.

BRIEF DESCRIPTION OF THE DRAWINGS

The objects and features of the present invention will become apparent from the following description of embodiments, given in conjunction with the accompanying drawings, in which:

FIG. 6 is an explanatory view that shows test results of the present embodiment and comparison examples.

FIGS. 7 to 16 are explanatory views that show test results in accordance with the embodiment of the present invention.

DETAILED DESCRIPTION OF THE EMBODIMENTS

Figure 1:
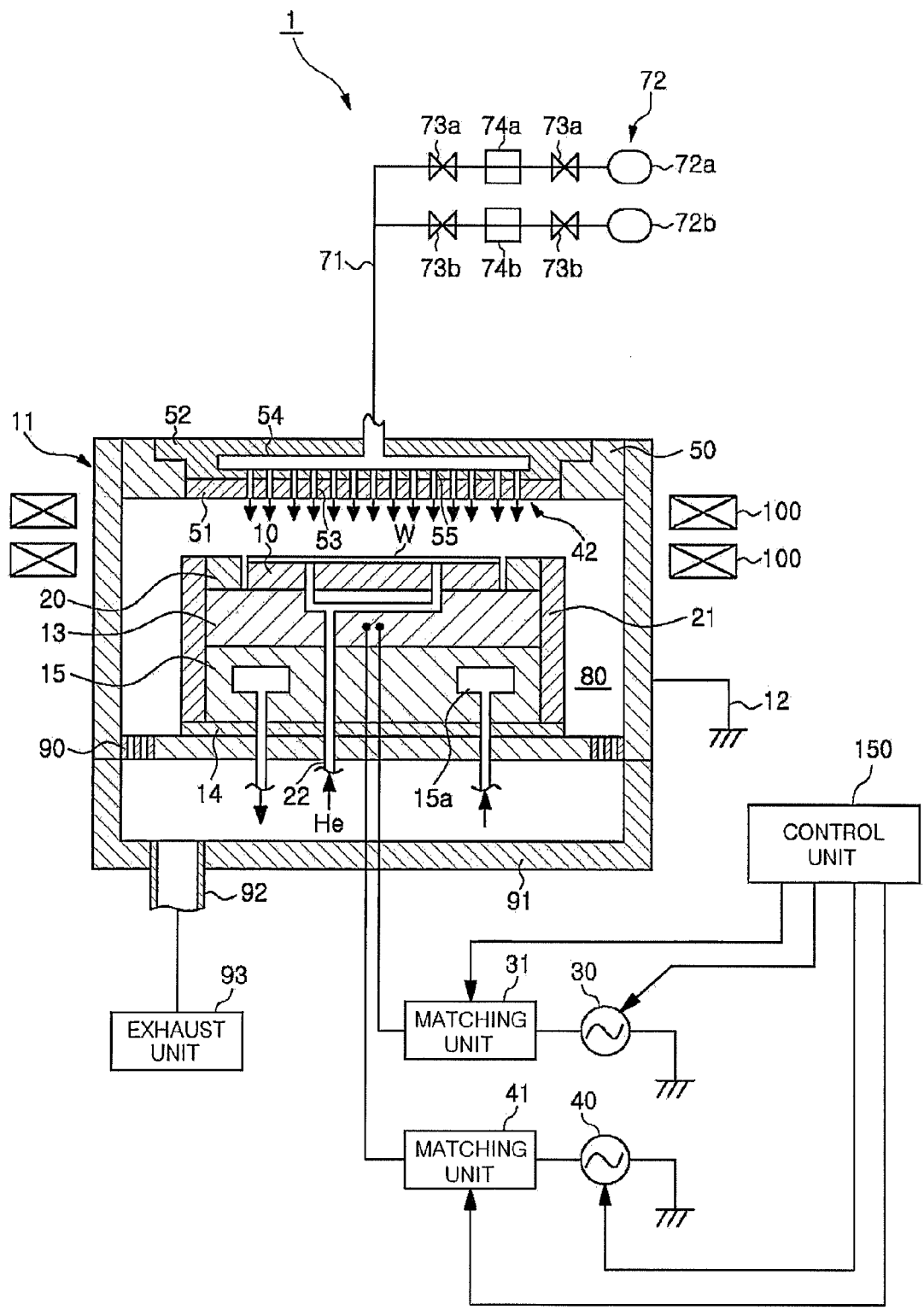
FIG. 1 is a vertical sectional view showing a schematic configuration of a plasma processing apparatus in accordance with an embodiment of the present invention.

Hereinafter, embodiments of the present invention will be described with reference to the accompanying drawings which form a part hereof. FIG. 1 is a vertical sectional view showing a schematic configuration of a plasma processing apparatus 1 in accordance with an embodiment of the present invention.

The plasma processing apparatus 1 includes a substantially cylindrical processing chamber 11 provided with a wafer chuck 10 for supporting a wafer W that is a silicon substrate. The processing chamber 11 is electrically grounded by a ground wire. The inner wall of the processing chamber 11 is covered with a liner (not shown) of which surface is covered with a thermal spray coating made of a plasma resistant material.

The bottom surface of the wafer chuck 10 is supported by a susceptor 13 serving as a lower electrode. The susceptor 13 is substantially disc-shaped and made of a metal such as, e.g., aluminum. On the bottom portion of the processing chamber 11, there is provided a support member 15 via an insulating plate 14. The susceptor 13 is supported by the upper surface of the support member 15. An electrode (not shown) is provided within the wafer chuck 10, so that the wafer W is attracted and held by an electrostatic force generated by applying DC voltage to the electrode.

A conductive correction ring 20 made of, e.g., silicon, for enhancing the uniformity of a plasma process is provided on the upper surface of the susceptor 13 and at the outer peripheral portion of the wafer chuck 10. The outer surfaces of the susceptor 13, the support member 15, and the correction ring 20 are covered with a cylindrical member 21 made of, e.g., quartz.

Inside the support member 15, a coolant passage 15a through which a coolant flows is provided in, e.g., a round ring shape. A temperature of the wafer W supported by the wafer chuck 10 can be controlled by adjusting the temperature of the coolant supplied from the coolant passage 15a. Further, a heat transfer gas line 22 for supplying, e.g., helium (He) gas as a heat transfer gas between the wafer chuck 10 and the wafer W supported by the wafer chuck is provided to extend through the susceptor 13, the support member 15, and the insulating plate 14.

The susceptor 13 is electrically connected, via a first matching unit 31, to a first high frequency power supply 30 for supplying a high frequency power to the susceptor 13 to generate plasma. The first high frequency power supply 30 may output a high frequency power of, e.g., 27 MHz to 100 MHz, and in this embodiment, it is configured to output a high frequency power of, e.g., 100 MHz. The first matching unit 31 matches an internal-impedance of the first high frequency power supply 30 with a load impedance. When the plasma is generated in the processing chamber 11, the internal-impedance of the first high frequency power supply 30 and the load impedance are seemingly matched by the first matching unit 31.

The susceptor 13 is also electrically connected, via a second matching unit 41, to a second high frequency power supply 40, which supplies a high frequency power to the susceptor 13 to apply a bias to the wafer W, thereby attracting ions to the wafer W. The second high frequency power supply 40 may output a high frequency power of, e.g., 400 KHz to 13.56 MHz, and in this embodiment, it is configured to output a high frequency power of, e.g., 13.56 MHz. The second matching unit 41 matches an internal-impedance of the second high frequency power supply 40 with a load impedance, similar to the first matching unit 31.

The first high frequency power supply 30, the first matching unit 31, the second high frequency power supply 40, and the second matching unit 41 are connected to a control unit 150 to be later described and their operations are controlled by the control unit 150.

Above the susceptor 13, serving as the lower electrode, an upper electrode 42 is provided opposite and parallel to the susceptor 13. The upper electrode 42 is held by a conductive support member 50 at the upper portion of the processing chamber 11. The upper electrode 42 is at the ground potential like the processing chamber 11.

The upper electrode 42 is formed of an electrode plate 51 and an electrode support body 52. The electrode plate 51 is disposed opposite to the wafer W which is supported by the wafer chuck 10. The electrode support body 52 holds the electrode plate 51 from above. In the electrode plate 51, a plurality of gas supply ports 53 through which a processing gas is supplied into the processing chamber 11 is formed to extend through the electrode plate 51. The electrode plate 51 is made of, e.g., a semiconductor or conductor having low resistance of low Joule heat. For example, in this embodiment, silicon is used for the electrode plate 51. The electrode support body 52 is made of a conductor, e.g., aluminum in this embodiment.

A substantially disc-shaped gas diffusion space 54 is provided in the center portion of the electrode support body 52. At the lower portion of the electrode support body 52, a plurality of gas holes 55 is formed to extend downward from the gas diffusion space 54. The gas supply ports 53 are connected to the gas diffusion space 54 via the corresponding gas holes 55.

A gas supply line 71 is connected to the gas diffusion space 54. The gas supply line 71 is also connected to a processing gas supply source 72, as shown in FIG. 1. A processing gas supplied from the processing gas supply source 72 is supplied to the gas diffusion space 54 through the gas supply line 71. The processing gas supplied to the gas diffusion space 54 is introduced into the processing chamber 11 through the gas holes 55 and the gas supply ports 53.

That is to say, the upper electrode 42 functions as a shower head for supplying the processing gas into the processing chamber 11.

The processing gas supply source 72 includes a coating gas supply unit 72a for supplying a coating gas used in a pre-coating process on the wafer W and an etching gas supply unit 72b for supplying an etching gas after the pre-coating process. Further, the processing gas supply source 72 includes valves 73a and 73b and flow rate control mechanisms 74a and 74b which are provided between the gas diffusion space 54 and the respective gas supply units 72a and 72b. A flow rate of the gas supplied to the gas diffusion space 54 is controlled by the flow rate control mechanisms 74a and 74b.

For example, a gas containing $SiCl_4$ is used as the coating gas used in the pre-coating process. In the embodiment, for example, a gas mixture of $SiCl_4/O_2$ is used as the coating gas.

Further, $CF_4$ is used as the etching gas.

An exhaust passage 80, formed at the bottom portion of the processing chamber 11, serves as a path through which an atmosphere in the processing chamber 11 is discharged to the outside of the processing chamber 11. Exhaust ports 90 are provided at the bottom portion of the processing chamber 11. An exhaust chamber 91 is formed below the exhaust ports 90 and connected to an exhaust unit 93 through an exhaust line 92. Accordingly, by driving the exhaust unit 93, the atmosphere in the processing chamber 11 is discharged through the exhaust passage 80 and the exhaust ports 90; and an internal pressure of the processing chamber 11 can be lowered to a predetermined degree of vacuum.

A ring magnet 100 is arranged concentrically around the processing chamber 11. The ring magnet 100 applies a magnetic field to a space between the wafer chuck 10 and the upper electrode 42. The ring magnet 100 is configured to be rotatable by a rotating mechanism (not shown).

The control unit 150 is provided in the above-described plasma processing apparatus 1. The control unit 150 includes, e.g., a computer and a program storage unit (not shown). The program storage unit stores programs for controlling each of the power supplies 30 and 40, each of the matching units 31 and 41, each of the flow rate control mechanisms 74a and 74b, and the like to operate the plasma processing apparatus 1.

Additionally, the programs are stored in a computer-readable storage medium such as a hard disk, a flexible disk, a compact disk, a magneto-optical disk, a memory card, and the like and may be installed in the control unit 150 from the storage medium.

The plasma processing apparatus 1 in accordance with the present embodiment is configured as described above. Next, the plasma etching process in the plasma processing apparatus 1 in accordance with the present embodiment will be described.

Figure 2:
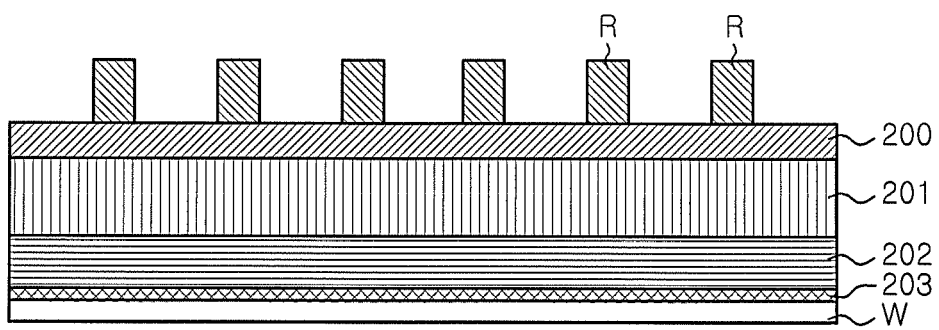
FIG. 2 is a cross-sectional view schematically showing a state in which a resist pattern has been formed on an antireflection film on a wafer.

In the plasma etching process, first, the wafer W is loaded into the processing chamber 11 to be mounted and supported on the wafer chuck 10. As shown in FIG. 2, for example, a resist pattern R is previously formed as an etching mask on the wafer W by a photo resist. An EUV resist is used for the resist pattern R and a thickness of the resist is about, e.g., 20 nm to 50 nm. An antireflection film 200 is formed under the layer of the resist pattern R. An organic film containing Si, for example, is used as the antireflection film 200. An organic film is formed as an insulation layer 201 under the layer of the antireflection film 200 and a silicon nitride layer 202 is formed under the insulation layer 201. A silicon oxide film 203 is interposed between the wafer W and the silicon nitride layer 202.

When the wafer W is supported by the wafer chuck 10, the inside of the processing chamber 11 is exhausted by the exhaust unit 93; and a processing gas for pre-coating is supplied at a predetermined flow rate into the processing chamber 11 from the processing gas supply source 72. At this time, a gas mixture of $SiCl_4/O_2$ is supplied at flow rate of 25/250 sccm as the processing gas.

In the meantime, a high frequency power is continuously applied from the first high frequency power supply 30 to the susceptor 13 serving as the lower electrode. Accordingly, the processing gas for pre-coating supplied into the processing chamber 11 is converted into plasma between the upper electrode 42 and the susceptor 13. Herein, the plasma is restricted between the upper electrode 42 and the susceptor 13 by the magnetic field of the ring magnet 100. At this time, a high frequency power from the second high frequency power supply 40 is not applied to the susceptor 13.

Figure 3:
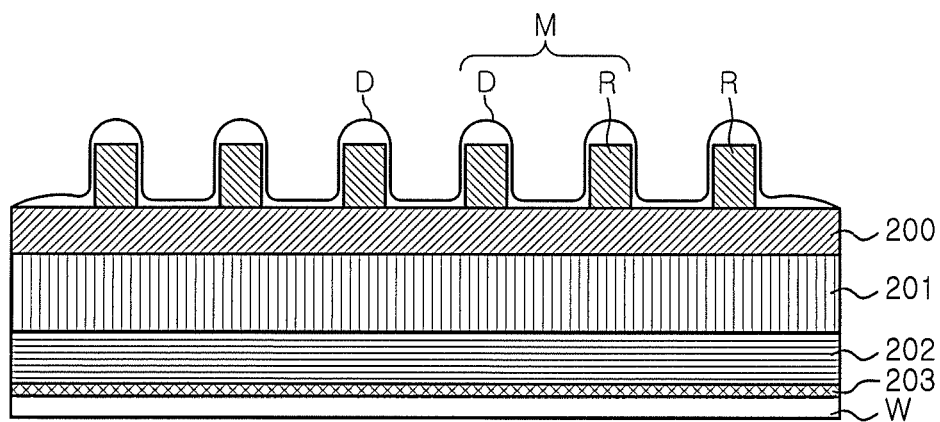
FIG. 3 is a cross-sectional view schematically showing a state in which the resist pattern on the antireflection film has been pre-coated.

A compound D containing Si is deposited on the resist pattern R by ions or radicals generated by the plasma in the processing chamber 11 to pre-coat the resist pattern R. At this time, the Si-containing compound D is deposited more thickly on the upper surface of the resist pattern R than on the side surface thereof, as shown in FIG. 3. The resist pattern R on which the Si-containing compound D has been deposited, functions as an etching mask M in the etching process to be later described. Here, a dimension of the etching mask M increases in a height direction compared to the resist pattern R while an increase in a width direction is suppressed to a minimum.

Figure 4:
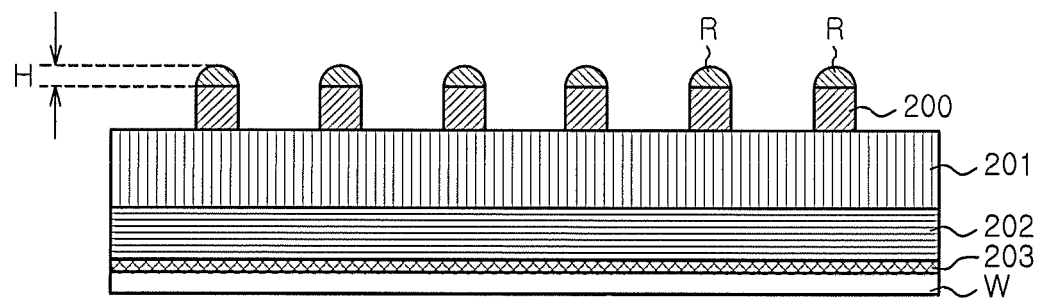
FIG. 4 is a cross-sectional view schematically showing a state in which the antireflection film has been etched after pre-coated.

After the resist pattern R has been pre-coated, the etching process is performed. In the etching process, $CF_4$ gas is supplied as the etching gas at a flow rate of 250 sccm from the etching gas supply unit 72b. The antireflection film 200 is etched by the ions or the radicals generated by the plasma in the processing chamber 11, by using, as the etching mask M, the resist pattern R onto which the Si-containing compound D is deposited. At this time, as shown in FIG. 4, the etching mask M is etched together. However, since the resist pattern R constituting the etching mask M has increased its thickness in the height direction by being pre-coated by the Si-containing compound D, the thickness of the remaining resist pattern R can be equal to or greater than a desired thickness H after the etching process. The desired thickness H is about, e.g., 10 nm. By keeping the remaining resist pattern R with a thickness equal to or greater than the desired thickness H, a masked portion of the antireflection film 200, as a target to be etched, can be prevented from being etched in the height direction thereof and a thickness of the antireflection film 200 can be maintained at a desired value after the etching process.

On the side surface of the resist pattern R, only a small amount of Si-containing compound D is deposited. For this reason, an increase in a horizontal width of the etching mask M is suppressed to a minimum, so that a line width of the antireflection film 200 can be prevented from increasing above a desired value.

In the above embodiment, the high frequency power from the second high frequency power supply 40 is not applied to the susceptor 13 during both processes of the pre-coating and the etching.

Therefore, no ions are attracted toward the wafer W. For this reason, the resist pattern R being etched by the attracted ions does not occur and thus, the decrement in thickness of the resist pattern R is reduced. Accordingly, also in this point of view, the thickness of the antireflection film 200 can be made to a desired value after the etching process.

In accordance with the above embodiment, in performing the etching process on the antireflection film 200, by using as a mask the resist pattern R formed by the EUV resist, the Si-containing compound D is deposited on the resist pattern R to pre-coat the resist pattern R. At this time, the Si-containing compound D is thickly deposited in the height direction of the resist pattern R. Accordingly, the height dimension of the resist pattern R increases by the Si-containing compound D deposited thereon. As a result, even though the resist pattern R formed by the EUV resist having a smaller thickness compared to a conventional ArF resist is used as the etching mask, the remaining resist pattern R can have the desired thickness H after the plasma etching. In other words, the masked portion of the antireflection film 200 is prevented from being etched in its height direction. As a result, a height of the antireflection film 200 can be maintained at a desired value after the etching process. The Si-containing compound D is deposited in a small amount on the side surface of the resist pattern R, so that the line width of the antireflection film 200 can be prevented from increasing above a desired value.

In the above embodiment, the gas mixture of $SiCl_4/O_2$ is used as a Si-containing gas, but He may be added to the gas mixture. According to a comparison test that has been performed by the present inventors, when He is added and a gas mixture of $SiCl_4/He/O_2$ is supplied, a flow rate thereof is preferable to be 25/200/250 sccm.

In the above embodiment, the gas mixture of $SiCl_4/O_2$ is used as the Si-containing gas. However, the present inventors have found that a gas mixture of $SiF_4/H_2$ may be used. When the gas mixture of $SiF_4/H_2$ is used, a flow rate thereof is preferable to be 50/100 sccm. Also in this case, the Si-containing compound D is mainly deposited in the height direction of the resist pattern R while the deposition amount on the side surface of the resist pattern R becomes small.

Also in the case of using the gas mixture of $SiF_4/H_2$, He may be added thereto. When He is added and the gas mixture of $SiF_4/H_2/He$ is supplied, a flow rate thereof is preferable to be 50/200/100 sccm.

In the above embodiment, $CF_4$ gas is used for the etching process of the antireflection film 200, but a gas mixture of $CF_4/CH_2F_2$ may be used.

[Test]

As the embodiment, the resist pattern R is pre-coated with the gas mixture of $SiCl_4/O_2$ or the gas mixture of $SiF_4/H_2$, and the antireflection film 200 is etched by using the resist pattern R that has been subjected to the pre-coating as the etching mask M. Then, a test was performed to confirm various conditions of the etching process which affect the dimensions of the antireflection film 200 after etching. At that time, a thickness of the EUV resist film was 50 nm. A condition of the plasma process for the pre-coating was set as follows. In a case of using the gas mixture of $SiCl_4/O_2$, a flow rate of $SiCl_4$ was set to 25 sccm; a flow rate of $O_2$ was varied in a range from 0 to 250 sccm; a flow rate of added He was varied in a range from 0 to 200 sccm; a pressure in the processing chamber 11 was varied in a range from 0.67 to 4 Pa; a power of the first high frequency power supply 30 was varied in a range from 200 to 1500 W; and a period of time for which the pre-coating is performed was varied in a range from 5 to 15 seconds.

In a case of using the gas mixture of $SiF_4/H_2$, a flow rate of $SiF_4$ was set to 25 sccm; a flow rate of $H_2$ was varied in a range from 0 to 250 sccm; a flow rate of added He was varied in a range from 0 to 400 sccm; a pressure in the processing chamber 11 was varied in a range from 0.67 to 8 Pa; a power of the first high frequency power supply 30 was varied in a range from 200 to 1500 W; and a period of time for which the pre-coating is performed was varied in a range from 5 to 60 seconds. In the case of using the gas mixture of $SiF_4/H_2$, a test was additionally performed under the following conditions. A flow rate of $SiF_4$ was varied in a range from 5 to 100 sccm; a flow rate of $H_2$ was set to 100 sccm; a flow rate of added He was set to 200 sccm; a pressure in the processing chamber 11 was set to 1.33 Pa; a power of the first high frequency power supply 30 was set to 500 W; and a period of time for which the pre-coating is performed was set to 5 seconds.

Further, in the pre-coating process, a power of the second high frequency power supply 40 was off in all of the above-described cases. Further, in all of the above-described cases, the etching was performed for 50 seconds under the following condition: a flow rate of $CF_4$ was set to 250 sccm; an added amount of $CH_2F_2$ was set to 13 sccm; a pressure in the processing chamber 11 was set to 10 Pa; a power of the first high frequency power supply 30 was set to 400 W; and a power of the second high frequency power supply 40 was off (OW).

As a comparison example, a test was also performed by changing the kind of gas mixed with $SiCl_4$.

Figure 5A:
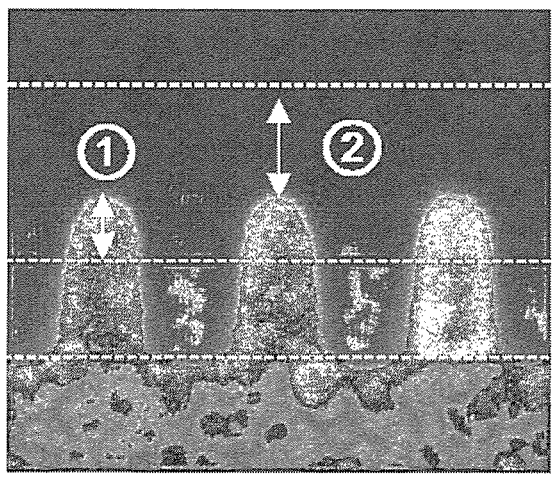
FIGS. 5A and 5B are explanatory views that show test results.
Figure 5B:
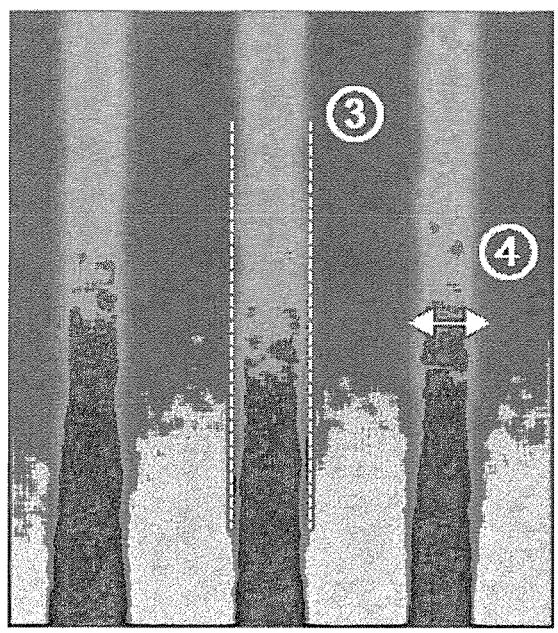

The results of the tests are illustrated in FIGS. 5A to 15. The circled numbers '1' to '4' in FIGS. 5A and 5B indicate items to be confirmed in the tests. FIG. 5A is a vertical sectional view showing a state in which the antireflection film 200 has been etched by using the resist pattern R as the etching mask M. The item '1' in FIG. 5A corresponds to 'PR Height' shown in FIGS. 6 to 15. The 'PR Height' indicates the height (thickness) H of the remaining resist pattern R after the plasma etching process. The item '2' in FIG. 5A corresponds to 'PR loss' shown in FIGS. 6 to 15, which indicates a difference between a height of the resist pattern R immediately after being pre-coated with the Si-containing compound D and the height H of the remaining resist pattern R after the plasma etching process. FIG. 5B is a top view of the state in FIG. 5A. The item '3' in FIG. 5B corresponds to 'LWR' shown in FIGS. 6 to 15. The 'LWR' represents as a figure a variation in the line width of the antireflection film 200 after the plasma etching process. The item '4' in FIG. 5B corresponds to 'CD' shown in FIGS. 6 to 15, which indicates the line width of the antireflection film 200 after the plasma etching process.

FIG. 6 depicts test results of cases where $N_2$, HBr, COS, $CF_4$, $SF_6$, and $NF_3$ are used, as the gas mixed with $SiCl_4$, in addition to the $O_2$ gas used in the present embodiment. 'Initial' shown in FIG. 6 represents the result obtained when the etching process is performed without performing the pre-coating. In the tests shown in FIG. 6, a pressure in the processing chamber 11 was set to 1.33 pa, a power of the first high frequency power supply 30 was set to 500 W, and a period of time for which the pre-coating is performed was set to 5 seconds. As shown in FIG. 6, when the gas mixed with $SiCl_4$ was $O_2$, it has been confirmed that the 'PR height', i.e., the thickness of the remaining resist pattern R after the etching process increased, compared to the case of the 'Initial'. Furthermore, it has been confirmed that the 'PR loss' decreased which means the improvement of an etching tolerance of the resist pattern R due to the pre-coating. Both of the 'LWR' and the 'CD' decreased and the dimensional precision of the antireflection film 200 after the etching process improved.

In the case of using $N_2$ as the gas mixed with $SiCl_4$, the 'PR loss' was almost the same as the case of using $O_2$, but other figures deteriorated compared to the case of using $O_2$. In the case of using HBr or COS, 'LWR' improved, but other figures deteriorated compared to the case of using $O_2$. In the cases of using $CF_4$, $SF_6$, and $NF_3$, it has been confirmed that 'PR Height' became minus values, i.e., the antireflection film 200 was etched in the height direction thereof. As shown in FIG. 6, in the cases of using $CF_4$, $SF_6$, and $NF_3$, the height and the width of the resist pattern R decreased after pre-coating, which means that the pre-coating was not properly performed. Consequently, it has been confirmed that $O_2$ is preferable as the kind of gas to be mixed with $SiCl_4$.

FIG. 7 shows test results of cases where $SiCl_4$/He was supplied at flow rate of 25/200 sccm as the processing gas for pre-coating and $O_2$ gas was mixed with $SiCl_4$/He at a flow rate ranging from 0 to 250 sccm. In these cases, a pressure in the processing chamber 11 was set to 1.33 Pa, a power of the first high frequency power supply 30 was set to 500 W, and a period of time for which the pre-coating is performed was set to 5 seconds.

As shown in FIG. 7, when a flow rate of $O_2$ was in a range from 0 to 25 sccm, it did not show a remarkable improvement in the 'PR Height'. However, when the flow rate of $O_2$ was in a range from 100 to 250 sccm, the 'PR Height' remarkably improved. That is, the 'PR Height' remarkably improved when a flow rate ratio between $SiCl_4$ gas and $O_2$ gas was in a range of 1:4 to 1:10.

FIG. 8 illustrates test results of cases where a high frequency power was varied in a range from 200 to 1500 W while $SiCl_4$/He/$O_2$ was supplied at flow rate of 25/200/250 sccm as the processing gas for pre-coating and the pre-coating was performed for 5 seconds. In these cases, a pressure in the processing chamber 11 was set to 1.33 Pa. As shown in FIG. 8, when the power of 500 W or more was applied, the 'PR Height' was remarkably improved, compared to the case of the 'Initial'.

FIG. 9 shows test results of cases where a power applied to the processing chamber 11 was 500 W and a pressure in the processing chamber 11 was varied in a range from 0.67 to 4 Pa. The other conditions were the same as those in the case of FIG. 8. When the pressure was varied in a range from 0.67 to 4 Pa, good results were obtained regardless of the pressure value. However, as shown in FIG. 9, the 'PR Height' decreased as the pressure decreased, and the 'CD' increased as the pressure increased. From the result shown in FIG. 9, the pressure in the processing chamber 11 is preferably set to be in a range from 0.67 to 4 Pa, and more preferably to be 1.33 Pa.

FIG. 10 shows test results of cases where an amount of He added to the gas mixture of $SiCl_4$/$O_2$ was varied. A flow rate of $SiCl_4$/$O_2$ was set to 25/250 sccm and the amount of added He was varied in a range from 0 to 200 sccm. A high frequency power was set to 500 W and a pressure in the processing chamber 11 was set to 1.33 Pa. When the amount of added He was varied in a range from 0 to 200 sccm, both the 'PR Height' and the 'PR loss' improved in all the cases, compared to the case of the 'Initial'. When the amount of added He was small, the 'LWR' and the 'CD' did not improve compared to when the amount of added He was large. As a result, in the case of adding He, a flow rate of $SiCl_4$/He/$O_2$ is preferable to be 25/200/250 sccm.

FIG. 11 shows test results of cases where a period of time for which the pre-coating is performed was varied. A flow rate of $SiCl_4$/He/$O_2$ was set to 25/200/250 sccm, a high frequency power was set to 500 W, and a pressure in the processing chamber 11 was set to 1.33 Pa. The period of time for which the pre-coating is performed was varied in a range from 5 to 15 seconds. All figures except the 'CD' improved after the pre-coating process. However, the 'CD' value increased when the period of time for which the pre-coating is performed was equal to or more than 10 seconds, compared to the case of the 'Initial' in which the pre-coating process was not performed.

Accordingly, the period of time for which the pre-coating is performed is preferable to be 5 seconds.

Next, the case when the gas mixture of $SiCl_4$/$H_2$ is used as the processing gas for pre-coating will be described.

FIG. 12 shows test results of cases where a high frequency power was varied in a range from 200 to 1500 W while a processing gas $SiCl_4$/He/$H_2$ for pre-coating was supplied at flow rate of 25/200/100 sccm and the pre-coating was performed for 5 seconds. In these cases, a pressure in the processing chamber 11 was set to 1.33 Pa. As shown in FIG. 12, improvements due to the pre-coating were observed and the degrees of the improvements were almost equal to each other regardless of the change in the applied power.

FIG. 13 shows test results of cases where a power applied to the processing chamber 11 was 500 W and a pressure in the processing chamber 11 was varied in a range from 0.67 to 8 Pa. The other conditions were the same as those in the case of FIG. 12. When the pressure was varied in a range from 0.67 to 8 Pa, good results were obtained regardless of the value of the pressure. However, as shown in FIG. 13, it has been confirmed that the 'LWR' slightly deteriorated when the pressure increased to 8 Pa. From the results shown in FIG. 13, the pressure in the processing chamber 11 is preferably set to be in a range from 0.67 to 4 Pa.

FIG. 14 shows test results of cases where a flow rate of $SiF_4$ was varied in a range from 5 to 100 sccm while a flow rate of $H_2$ was set to 100 sccm, a flow rate of added He was 200 sccm, a pressure in the processing chamber 11 was 1.33 Pa, a power of the first high frequency power supply 30 was 500 W, and a period of time for which the pre-coating is performed was 5 seconds. From these tests, it has been confirmed that when the flow rate of $SiF_4$ was in a range from 25 to 100 sccm with respect to $H_2$ having the flow rate of 100 sccm, the 'PR Height' and the 'PR loss' remarkably improved. That is, the 'PR Height' and the 'PR loss' remarkably improved when a flow rate ratio between $SiF_4$ gas and $H_2$ gas was in a range of 1:1 to 1:4.

FIG. 15 shows test results of cases where an amount of He added to the gas mixture of $SiF_4$/$H_2$ was varied. A flow rate of $SiF_4$/$H_2$ was set to 50/100 sccm and the amount of added He was varied in a range from 0 to 400 sccm. A high frequency power was set to 500 W and a pressure in the processing chamber 11 was set to 1.33 Pa. When the amount of added He decreased, the 'CD' value increased. The other figures except the 'CD' did not show remarkable differences. As a result, the amount of added He is preferable to be in a range from 200 to 400 sccm when the flow rate of $SiF_4$/$H_2$ is 50/100 sccm.

FIG. 16 shows test results of cases where a period of time for which pre-coating is performed was varied. A flow rate of $SiF_4$/He/$H_2$ was set to 50/200/100 sccm, a high frequency power was 500 W, and a pressure in the processing chamber 11 was 1.33 Pa. The period of time for which pre-coating is performed was varied in a range from 5 to 60 seconds. All figures except the 'CD' improved due to the pre-coating process. However, a tendency in which the 'CD' value increases when the period of time for which pre-coating is performed increases is shown. Accordingly, the period of time for which pre-coating is performed is preferable to be 5 seconds.

While the invention has been shown and described with respect to the embodiments, it will be understood by those skilled in the art that various changes and modifications may be made without departing from the scope of the invention as defined in the following claims.

What is claimed is:

1. A plasma etching method for plasma etching, in a processing chamber, an antireflection film laminated on an organic film formed on a substrate by using an etching mask made of a resist film formed on the antireflection film, the plasma etching method comprising:

depositing a Si-containing compound on the etching mask made of the resist film by using plasma of a Si-containing gas in the processing chamber; and etching the antireflection film in a state where the Si-containing compound is deposited on the etching mask, wherein the Si-containing gas is a gaseous mixture of $SiCl_4$ gas and $O_2$ gas, and wherein a flow rate ration of the $SiCl_4$ gas to the $O_2$ gas is controlled to be in a range from 1:4 to 1:10 such that the Si-containing compound deposited on an upper surface of the etching mask is thicker than Si-containing compound deposited on a side surface of the etching mask.

2. The plasma etching method of claim 1, wherein the resist film is an EUV resist film.

3. The plasma etching method of claim 2, wherein a thickness of the EUV resist film is 20 to 50 nm.

4. The plasma etching method of claim 1, wherein He is added to the gas mixture of $SiCl_4/O_2$.

5. The plasma etching method of claim 1, wherein the antireflection film is an organic film containing Si.

6. The plasma etching method of claim 1, wherein the antireflection film is etched with plasma of $CF_4$ gas.

7. The plasma etching method of claim 1, wherein the antireflection film is etched with plasma of $CF_4/CH_2F_2$ gas.

* * * * *